.

US009824799B2

(12) United States Patent
Kampl et al.

(10) Patent No.: US 9,824,799 B2
(45) Date of Patent: Nov. 21, 2017

(54) MEASURING RESISTOR AND METHOD FOR PRODUCING A MEASURING RESISTOR

(71) Applicant: Infineon Technologies Austria AG, Villach (AT)

(72) Inventors: Severin Kampl, Villach (AT); Uwe Kirchner, Feldkirchen (AT)

(73) Assignee: Infineon Technologies Austria AG, Villach (AT)

( * ) Notice: Subject to any disclaimer, the term of this patent is extended or adjusted under 35 U.S.C. 154(b) by 91 days.

(21) Appl. No.: 14/800,048

(22) Filed: Jul. 15, 2015

(65) Prior Publication Data

US 2016/0020004 A1    Jan. 21, 2016

(30) Foreign Application Priority Data

Jul. 16, 2014  (DE) .................. 10 2014 109 990

(51) Int. Cl.
| H01C 7/00 | (2006.01) |
| G01R 19/00 | (2006.01) |
| H01C 17/06 | (2006.01) |
| G01R 1/20 | (2006.01) |
| H01C 7/06 | (2006.01) |
| G01R 3/00 | (2006.01) |

(52) U.S. Cl.
CPC .............. *H01C 7/00* (2013.01); *G01R 1/203* (2013.01); *G01R 19/0092* (2013.01); *H01C 7/06* (2013.01); *H01C 17/06* (2013.01); *G01R 3/00* (2013.01)

(58) Field of Classification Search
CPC ............. H01C 7/00; H01C 7/06; H01C 17/06

USPC ........................................................... 338/61
See application file for complete search history.

(56) References Cited

U.S. PATENT DOCUMENTS

| 3,864,825 | A | * | 2/1975 | Holmes | ................. | H01C 7/006 |
| | | | | | | 216/16 |
| 5,155,655 | A | * | 10/1992 | Howard | ................. | H01L 23/642 |
| | | | | | | 361/303 |
| 5,162,977 | A | * | 11/1992 | Paurus | ................. | H05K 1/162 |
| | | | | | | 174/68.1 |
| 5,258,736 | A | * | 11/1993 | Kristen | ................. | H01C 7/008 |
| | | | | | | 219/448.17 |
| 5,270,493 | A | | 12/1993 | Inoue et al. | | |
| 5,519,374 | A | * | 5/1996 | Schrank | ................. | H01C 7/06 |
| | | | | | | 338/22 R |
| 6,284,982 | B1 | | 9/2001 | Kusner et al. | | |
| 6,767,445 | B2 | | 7/2004 | Kukanskis et al. | | |

(Continued)

FOREIGN PATENT DOCUMENTS

| DE | 10338041 B3 | 2/2005 |
| DE | 69920280 T2 | 9/2005 |

(Continued)

OTHER PUBLICATIONS

DE102009010214, Marz etal., Sep. 2010; EPO machine translation.*

*Primary Examiner* — Kyung Lee
(74) *Attorney, Agent, or Firm* — Murphy, Bilak & Homiller, PLLC

(57) ABSTRACT

A measuring resistor for high-current measurements is provided, which has a defined resistance value. The measuring resistor has a resistive layer having a sheet resistivity. The resistance value of the measuring resistor is defined by the resistive layer and is less than the sheet resistivity of the resistive layer.

17 Claims, 8 Drawing Sheets

(56) References Cited

U.S. PATENT DOCUMENTS

| | | | |
|---|---|---|---|
| 6,943,414 B2 | 9/2005 | Kar Roy et al. | |
| 7,649,439 B2 * | 1/2010 | Thomsen | G01K 7/028 338/22 R |
| 8,531,264 B2 * | 9/2013 | Li | H01C 7/06 338/195 |
| 8,730,003 B2 * | 5/2014 | Smith | H01C 1/148 29/610.1 |
| 2003/0016118 A1 * | 1/2003 | Schemenaur | H01C 7/006 338/309 |
| 2003/0231099 A1 * | 12/2003 | Schemenaur | H01C 7/006 338/308 |
| 2004/0216303 A1 * | 11/2004 | Berlin | H01C 7/003 29/610.1 |
| 2005/0094465 A1 | 5/2005 | Gervasi et al. | |

FOREIGN PATENT DOCUMENTS

| | | |
|---|---|---|
| DE | 60036907 T2 | 8/2008 |
| DE | 102009010214 A1 | 9/2010 |
| DE | 202013011690 U1 | 2/2014 |
| WO | 0045624 A1 | 8/2000 |
| WO | 0056128 A1 | 9/2000 |

* cited by examiner

MEASURING RESISTOR AND METHOD FOR PRODUCING A MEASURING RESISTOR

PRIORITY CLAIM

This application claims priority to German Patent Application No. 10 2014 109 990.7 filed on 16 Jul. 2014, the content of said application incorporated herein by reference in its entirety.

TECHNICAL FIELD

The present invention relates to a measuring resistor for high-current measurements, and to a method for producing the same.

BACKGROUND

A measuring resistor, also called shunt resistor, is used to measure an electric current. The measuring resistor is inserted into the current path for this purpose. In order to have the lowest possible ohmic losses, this resistor generally has a very small value, for example in the milliohms (mΩ) range.

High currents are often to be measured in the field of power components. In the context of this application, high current is understood to mean an electric current of from approximately one ampere to hundreds of amperes.

A current measurement can be used for example to control a component, i.e. the current measurement is used in a feedback loop. Furthermore, there are many further applications in which a high current is to be measured, for example in the laboratory during development/qualification. A purely ohmic resistance is desirable for a current measurement, i.e. an ohmic resistance having no parasitic components such as, in particular, parasitic inductances. Parasitic elements in a power loop, i.e. for example in a high-current path, can lead to overvoltage spikes and bring about an increased stress on components. Said stress can, for example if a voltage breakdown occurs, damage semiconductors.

One exemplary field of application for a measuring resistor for a high-current measurement is voltage converters. Parasitic elements, in particular inductances, reduce the efficiency of the converters. The inductances can form resonant circuits which lead to superposed oscillations. Oscillations reduce the signal-to-noise ratio of the measurement. That is to say that it becomes necessary to filter the measurement signal. A low-pass filter is required for this purpose. This filtering reduces the dynamic range of the control loop, or in other words the response time is artificially increased.

The lengthening of the response time that is necessary owing to the parasitic elements has the effect that time-critical functions, such as, for example, protective functions in the form of turn-off in the event of overcurrent, have to have an artificially low response threshold in order to compensate for the longer loop time. Thus, the performance of a power switch cannot be fully utilized.

For these and other reasons, there is a need for the present invention.

SUMMARY

According to an embodiment of a measuring resistor for high-current measurements, which has a defined resistance value, the measuring resistor comprises a resistive layer having a sheet resistivity. The resistance value of the measuring resistor is defined by the resistive layer and is less than the sheet resistivity of the resistive layer.

According to an embodiment of a method for producing a measuring resistor for high-current measurements, which has a defined resistance value, the method comprises: providing a resistive layer having an upper surface and a lower surface which are spaced apart from one another by a thickness of the resistive layer, wherein the resistive layer has a sheet resistivity, and wherein the resistance value of the measuring resistor is defined by the resistive layer and is less than the sheet resistivity of the resistive layer; and providing a first metal layer and a second metal layer, wherein one of: the first metal layer is arranged on the upper surface of the resistive layer and the second metal layer is arranged on the lower surface of the resistive layer opposite the first metal layer; or the first metal layer and the second metal layer are arranged on the upper surface of the resistive layer, wherein they do not touch one another and are at a first distance from one another over a first width, wherein the first distance is less than the first width.

According to another embodiment of a measuring resistor for high-current measurements, the measuring resistor comprises a resistive region, and a first electrical contact and a second electrical contact which contact the resistive region and are arranged such that a high electric current to be measured is conducted via a current path through the resistive region. A length of the current path between the first electrical contact and the second electrical contact is shorter than a width of the current path.

Those skilled in the art will recognize additional features and advantages upon reading the following detailed description, and upon viewing the accompanying drawings.

BRIEF DESCRIPTION OF THE DRAWINGS

The accompanying drawings are intended to enable a better understanding of the exemplary embodiments and form part of this description. The drawings illustrate exemplary embodiments and together with the description help to explain the principles underlying the exemplary embodiments. Other exemplary embodiments and many advantages of the exemplary embodiments can thus be better understood. The elements in the drawings are not necessarily drawn in a manner true to scale relative to one another. Similar reference signs generally denote similar parts.

Features and/or elements are illustrated with specific dimensions relative to one another primarily for the sake of clarity and in order to facilitate understanding. Consequently, relative dimensions in actual implementations can deviate from those illustrated herein. Indications such as top, bottom, vertical, horizontal are used to facilitate the understanding of the figures and should not be understood in a restrictive way.

DETAILED DESCRIPTION

The following description, for explanation purposes and non-restrictively, by reference to the accompanying drawings, sets out various embodiments including many specific details thereof in order to enable a thorough understanding of the present invention. It goes without saying that other embodiments that differ in one or more of these specific details can be implemented, without departing from the concept of the present invention. Accordingly, the following description is intended only for illustrative, non-restrictive purposes, and the concept of the present invention is intended to be defined by the appended claims.

It additionally goes without saying that the features of the various exemplary embodiments described herein can be combined with one another, unless specifically indicated otherwise.

Figure 1:
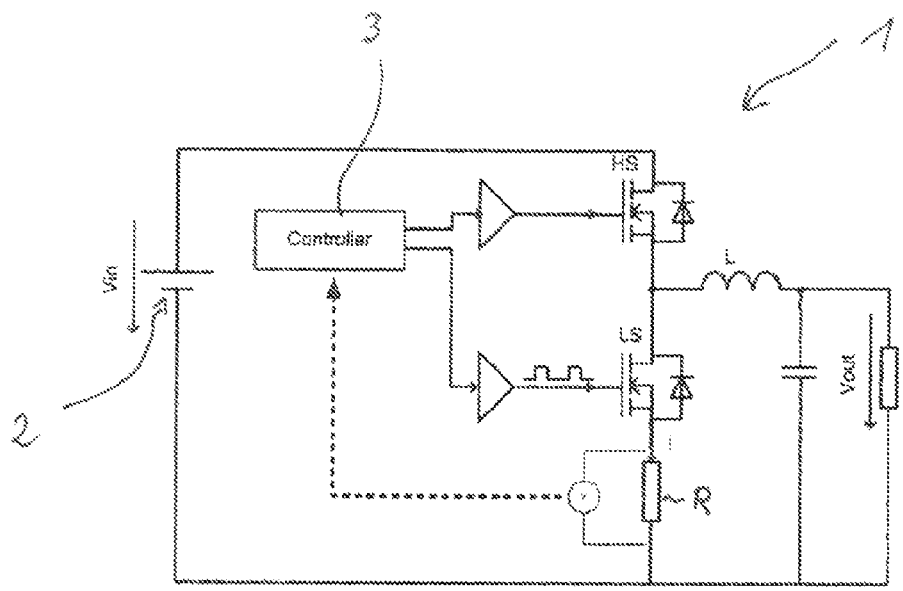
FIG. 1 shows one possible application circuit for a measuring resistor from the prior art.

FIG. 1 shows in schematic form a buck converter 1, such as is known in the prior art. Two MOSFET transistors HS and LS are connected in series in a current path. The current path can be a high-current path via which an electric current I of from one ampere to hundreds of amperes can flow, for example 700 A, 800 A or 900 A. The current path is coupled to an input voltage source 2, which can output an input voltage $V_{in}$. By means of a controller 3, the two transistors HS and LS can be switched on and off via their gates. A measuring resistor R is situated in the current path. The voltage $V_{Meas}$ dropped across the measuring resistor R is measured and fed back to the controller 3. According to Ohm's law, the measurement voltage $V_{Meas}$ is proportional to the resistance R and proportional to the current I to be measured. An output voltage $V_{out}$ is tapped off via an LC element across the transistor LS.

In the prior art, the measuring resistor R is embodied as a discrete metal resistor. It is embodied externally for example as a conventional surface-mounted resistor. The parasitic inductance associated therewith is dependent on the geometrical dimensions of the resistor. In order to obtain the required resistance value, the measuring resistors in the prior art have a length that is above the cross-sectional dimensions. This is associated with a parasitic inductance that limits the bandwidth. The bandwidth achieved in the prior art is therefore a maximum of 100 MHz.

The invention provides a measuring resistor for high-current measurements, which has a defined resistance value. When determining the defined resistance value, firstly the desired measurement voltage should be taken into consideration, which is calculated as $$U = R \times I \tag{1}$$

The measurement voltage range is generally from approximately a few hundred millivolts (mV) to one volt. In the case of currents to be measured of from one ampere to several amperes, a resistance value in the range of a few hundred 100 milliohms results.

Secondly, the power loss dropped across the measuring resistor should be taken into consideration. The power loss across the resistor R is calculated as $$P = I^2 \times R \tag{2}$$

In order to keep the power loss low, the resistance value of the measuring resistor R is advantageously in the range of a few hundred milliohms from the standpoint of a low power loss as well.

According to the invention, the resistance value of the measuring resistor is defined by a resistive layer having a sheet resistivity greater than the resistance value of the measuring resistor.

The resistive layer can be formed by a film, or in other words can be a film resistor. A film can be laminated onto a carrier. However, a resistive layer can also be formed by other application techniques.

The sheet resistivity describes an electrical resistance of a resistive layer which has a specific defined thickness. It can be derived from the resistivity of the material from which the resistive layer is formed.

As is known, a material is characterized by its resistivity ρ. The sheet resistance $R_{FL}$ is calculated as $$R_{FL} = \rho / d \tag{3}$$

wherein d is the thickness of the resistive layer.

The resistance of a delimited resistive layer having a length l and a width b is calculated as $$R = R_{FL} \times l/b \tag{4}$$

wherein the current enters over the width b and flows through the resistive layer in parallel over the length l. It is evident from equation (4) that the resistance R of a square resistive layer is always equal to the sheet resistance, independently of the absolute edge length of the square.

Therefore, besides the resistivity of the layer material and the thickness d of the layer, only the ratio of length l to width b is crucial for the resistance value of a resistive layer.

A defined thickness d of the resistive layer can be one micrometer ($10^{-6}$ m). A defined thickness d of a resistive layer can also be 0.4 µm. Another thickness d of a resistive layer can be 0.2 µm. A thickness d of a resistive layer can be 0.1 µm.

The sheet resistance applies if the current flows through the resistive layer parallel to the layer. The current then enters for example at one end face and emerges again at an opposite end face. The thinner the layer, the higher its sheet resistance with constant resistivity.

A resistive layer can be formed from nickel-phosphorus. A nickel-phosphorus alloy can have a different sheet resistance depending on the layer thickness. A nickel-phosphorus alloy can contain approximately 90 percent nickel and approximately 10 percent phosphorus. A nickel-phosphorus alloy can also contain more than 90 percent nickel and less than 10 percent phosphorus, the electrical resistivity decreasing as the phosphorus content decreases. A nickel-phosphorus layer having a thickness of 1 µm can have a sheet resistance of 10Ω. A nickel-phosphorus layer having a thickness of 0.4 µm can have a sheet resistance of 25Ω. A nickel-phosphorus layer having a thickness of 0.2 µm can have a sheet resistance of 50Ω. A nickel-phosphorus resistive layer having a thickness of 0.1 µm can have a sheet resistance of 100Ω. Resistive materials other than nickel-phosphorus are possible which have a resistivity approximately of the same order of magnitude.

In one exemplary use of a nickel-phosphorus layer having a thickness of 0.4 µm as a resistive layer (sheet resistance thus 25Ω), with equation (4) it is possible to achieve a resistance value of 250 mΩ if the ratio l/b (length to width) is 1/100, that is to say the width of the resistor is a hundred times its length and the current flows parallel to the layer thickness from one wide side to the other. In one embodiment, the length l of the layer through which the current flows can then be approximately 5 µm, while the width over which the current couples into and out of the layer is approximately 500 µm.

Since the length l should be very much smaller than the width b, embodiments are also conceivable in which the current does not flow parallel to the layer, but rather perpendicularly to the layer. The thickness d of the layer then becomes the length l over which the electric current flows.

The resistance for a resistive layer flowed through perpendicularly is then calculated with equations (3) and (4) as:

$$R = \rho \times d/A, \text{ or } R = R_{FL} \times d^2/A \quad (5)$$

wherein A denotes the entrance area of the current and d denotes the thickness of the resistive layer.

A nickel-phosphorus layer can have, depending on composition, a resistivity of between approximately $\rho = 10^{-7}$ Ωm and approximately $\rho = 10^{-6}$ Ωm. In order to obtain a desired measurement resistance value of R=100 mΩ for example given a thickness of d=1 µm, the entrance and exit area A can be approximately between 1 and 10 µm².

Independently of whether the current flows parallel to the resistive layer or perpendicularly to the resistive layer, the resistive layer and the electrical contacts for coupling the measurement current in and out are dimensioned in such away that in the resistive layer a current path forms whose length between the electrical contacts is shorter than a width of the current path; byway of example, the length is one tenth or one hundredth of the width. The electric current thus flows through a resistive volume over a width and/or height that are/is significantly greater than the length over which the current flows through the volume. The formation of a very low parasitic inductance is achieved by virtue of this relatively short length.

Figure 2:
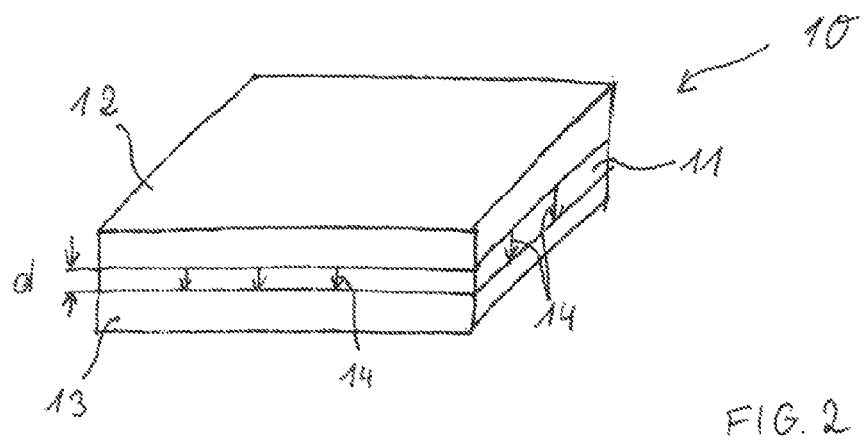
FIG. 2 schematically shows a first embodiment of a measuring resistor in perspective view for a so-called vertical current flow.

FIG. 2 schematically shows a first embodiment of a measuring resistor 10 in a perspective view. The measuring resistor 10 comprises a resistive layer 11 having a thickness d. The resistive layer 11 defines a resistive region. A first metal layer 12 is arranged on an upper surface of the resistive layer 11. The first metal layer 12 forms a first electrical contact, which contacts the resistive layer 11. A second metal layer 13 is arranged on a lower surface of the resistive layer 11. The lower metal layer 13 is spaced apart from the upper metal layer 12 by the thickness d of the resistive layer 11. The lower metal layer 13 forms a second electrical contact, which contacts the resistive region 11. A high current I to be measured can be conducted from the first electrical contact to the second electrical contact. The current to be measured then flows along the arrows 14, indicating the current flow. The current to be measured therefore flows through the thickness of the resistive layer from the first metal layer 12 to the second metal layer 13. The resistive layer 11 is arranged between the metal layers 12 and 13.

The first metal layer and the second metal layer do not touch one another. The resistive layer 11 can be a resistive layer as described above. In particular, the resistive layer 11 can comprise a nickel-phosphorus alloy. The sheet resistivity of the resistive layer 11 can be between 10Ω and 30Ω. The resistivity of the material from which the resistive layer 11 is formed can be between $\rho = 10^{-7}$ Ωm and approximately $\rho = 10^{-6}$ Ωm.

In the further application, arrangements as illustrated in FIG. 2 in which the electric current to be measured flows through the thickness of the resistive layer are designated as embodiments with vertical current flow.

Figure 3:
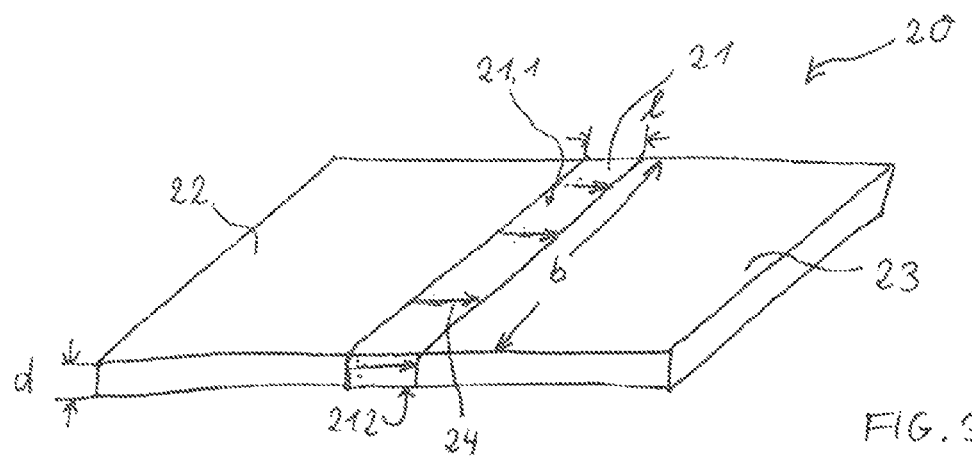
FIG. 3 schematically shows a second embodiment of a measuring resistor in perspective view for a so-called horizontal current flow.

FIG. 3 schematically shows a second embodiment of a measuring resistor 20 in perspective view. The measuring resistor 20 comprises a resistive layer 21. The resistive layer 21 has a thickness d that denotes a distance between an upper surface 21.1 and a lower surface 21.2 of the resistive layer 21.

The measuring resistor 20 has a first electrical contact 22 and a second electrical contact 23, which are arranged in a manner substantially coplanar with respect to the resistive layer 21, i.e. lie in one plane with the latter. The first electrical contact 22 is formed by a first metal layer, and the second electrical contact 23 is formed by a second metal layer. The resistive layer 21 is arranged between the first metal layer 22 and the second metal layer 23. The first and second metal layers are arranged such that they do not touch one another. They are at a distance l from one another over a width b.

In other words, the resistive layer 21 has a width b and a length l. Arrows 24 indicate that a current to be measured flows from the first electrical contact 22 to the second electrical contact 23 through the resistive layer 21. The current flows parallel to the layer extent of the resistive layer 21. It is fed in over the width b and flows over the length l.

Embodiments in accordance with FIG. 3 in which the current flows parallel to the layer extent will be designated hereinafter as embodiments with horizontal current flow.

It is pointed out that the designations vertical and horizontal current flow do not make any statement about the actual orientation of the resistive layer in space. "Vertical" merely means perpendicular to the layer extent and "horizontal" means parallel to the layer extent.

A third to seventh embodiment of a measuring resistor are described below with reference to FIGS. 4 to 8. Embodiments 3 to 7 are all based on a vertical current flow.

Figure 4:
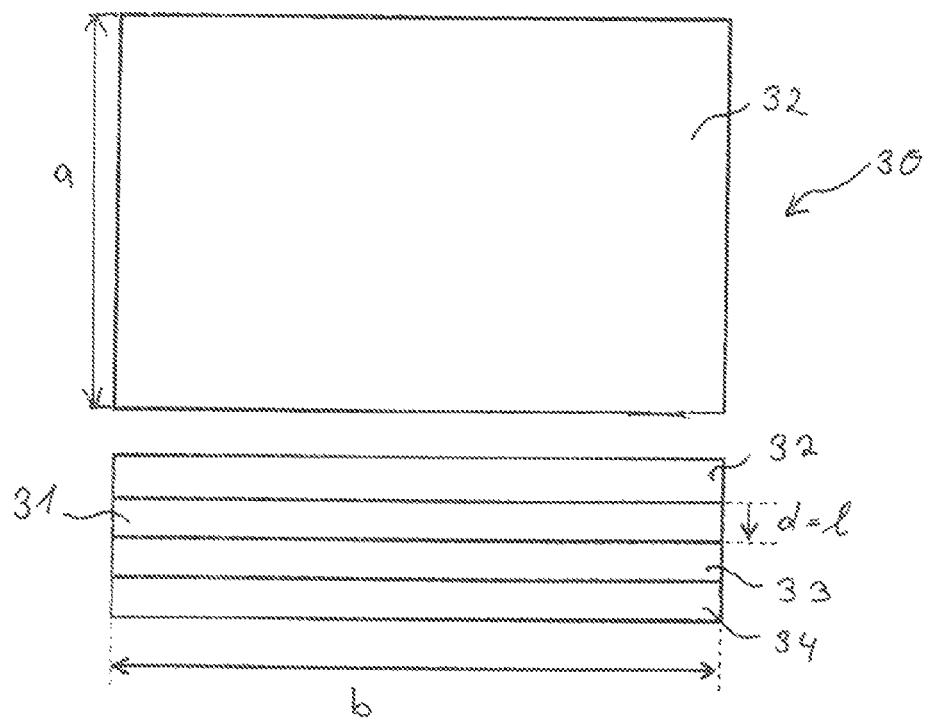
FIG. 4 schematically shows a third embodiment of a measuring resistor in plan view and side view (vertical current flow)

FIG. 4 schematically shows a measuring resistor 30 for high-current measurements in accordance with the third embodiment. The measuring resistor 30 has a defined resistance value. The measuring resistor 30 comprises a resistive layer 31, which defines the resistance value. The third embodiment is based on a vertical current flow.

Measuring resistor 30 has a first electrical contact 32 and a second electrical contact 33. Measuring resistor 30 furthermore has a carrier 34. The second electrical contact 33 is arranged on the carrier 34. The resistive layer 31 is arranged on the second electrical contact 33. The first electrical contact 32 is arranged on the resistive layer 31. The first and second electrical contacts can be formed from metal layers, for example from copper. The carrier 34 can be an FR4 substrate. FR4 is a glass fiber mat impregnated with epoxy resin, a material that is often used for printed circuit boards. The carrier 34 can also be formed from some other suitable material. The carrier 34 is optional.

The resistive layer 31 has a width b and a thickness d, which designates an electrical length l. The electrical length l of the resistive layer is determined by the distance between the first electrical contact 32 and the second electrical contact 33, or by the thickness d of the resistive layer 31. An electric current flows from the first electrical contact 32 to the second electrical contact 33.

The length l/thickness d is less than the width b. The thickness d squared is, in particular, less than an entrance area A of the current that results from the width b times an extent a perpendicular to the width b. The defined resistance value of the measuring resistor 30 is thus less than the sheet resistance of the resistive layer 31 that results from the resistivity ρ of the material of the resistive layer and the thickness of the resistive layer (see equations 3 and 5). In one embodiment, the resistive layer 31 has a sheet resistivity of 10Ω. A sheet resistivity of 10Ω can be achieved, for example, if nickel-phosphorus is chosen as material and the thickness of the nickel-phosphorus layer is 1 μm. In this embodiment, by way of example, the entrance area A of the current is 100 μm, and so the defined resistance value of the measuring resistor 30 is 100 mΩ.

Figure 5:
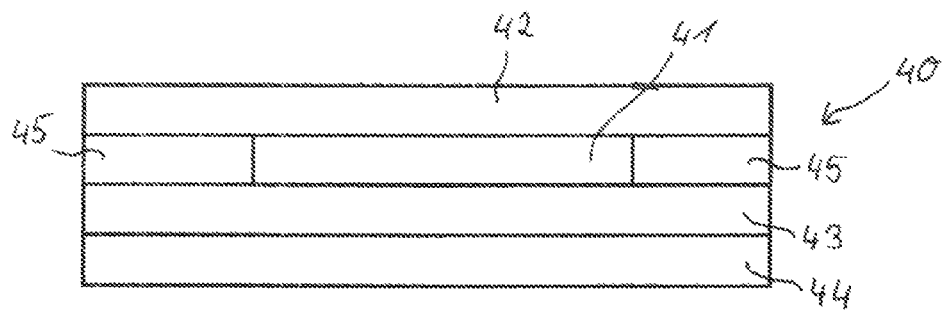
FIG. 5 shows a schematic side view of a fourth embodiment of a measuring resistor (vertical current flow)

FIG. 5 shows a schematic side view of a measuring resistor 40 in accordance with the fourth embodiment, i.e. with vertical current flow. The measuring resistor 40 has a resistive layer 41. A first metal layer 42 is applied on an upper surface of the resistive layer 41, said first metal layer constituting a first electrical contact. A second metal layer 43 is applied on a lower surface of the resistive layer 41, said second metal layer constituting a second electrical contact. The explanations given above hold true for the dimensioning of the resistive layer 41. The construction comprising metal layer-resistive layer-metal layer is in turn arranged on a carrier 44, which can comprise a substrate such as FR4 or the like. The carrier 44 is optional.

The fourth embodiment illustrated in FIG. 5 differs from the third embodiment illustrated in FIG. 4 by virtue of capacitive layers 45, which are arranged laterally with respect to the resistive layer 41 and likewise extend between the two electrical contacts 42 and 43. The capacitive layers 45 are arranged in a manner substantially coplanar with respect to the resistive layer 41.

A capacitive layer is produced from an electrically nonconductive material. The capacitive layer 45 can have a dielectric constant or relative permittivity having a value of between approximately 4 and 5. The relative permittivity can have, in particular, a value of 4.4. The capacitive layer 45 or the capacitive layers 45 has or have an upper surface facing the first metal layer 42 and a lower surface facing the second metal layer 43. The upper surface and the lower surface of the capacitive layer 45 are spaced apart from one another by the thickness of the capacitive layer. The first electrical layer 42 thus extends over the upper surface of the capacitive layer or of the capacitive layers 45 and over the upper surface of the resistive layer 41. The metal layer 43 extends over the lower surface of the capacitive layer or layers 45 and of the resistive layer 41.

FIG. 5 shows a side view or a cross-sectional view of the fourth embodiment. It should be understood that, in accordance with the above explanations, the resistive layer 41 is structured in order to provide a defined resistance value. The capacitive layers 45 illustrated as separated in FIG. 5 can touch one another outside the sectional plane/side view illustrated, i.e. form a common capacitive layer 45.

The measuring resistor according to the invention, independently of the respective embodiment, has a very low parasitic inductance as a result of its very short electrical length. The bandwidth in the application can thus be raised into the gigahertz range. The introduction of a capacitive film leads to a formation of a capacitor between the electrical contact 42 and the second electrical contact 43. In the equivalent circuit diagram, a capacitor C is thus connected in parallel with the measuring resistor R. The very high bandwidth achieved is thereby influenced in a targeted manner. It can be reduced somewhat in order to counteract oscillation tendencies. The bandwidth can be shifted in a targeted manner with the aid of the additional capacitors.

Figure 6:
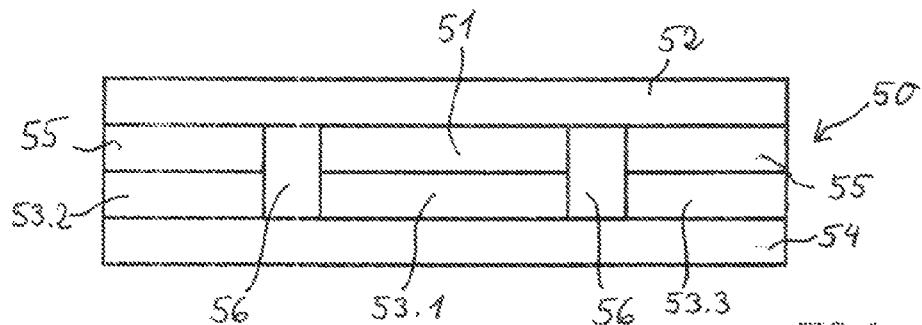
FIG. 6 shows a schematic side view of a fifth embodiment of a measuring resistor (vertical current flow)

FIG. 6 shows in a schematic side view or sectional view a measuring resistor 50 in accordance with the fifth embodiment, i.e. once again with vertical current flow. The measuring resistor 50 has a resistive layer 51, a first electrical contact 52, a second electrical contact 53.1, 53.2, 53.3, a carrier 54, capacitive layers 55 and delimiting spaces 56. The resistive layer 51 lies between the first electrical contact 52 and the second electrical contact 53.1. The second electrical contact 53.1 and the resistive layer 51 are laterally delimited by delimiting spaces 56. Said delimiting spaces 56 can be empty or filled with air, or be filled by a suitable nonconductive material. The second electrical contact 53.1 and the spaces 56 are arranged on the carrier 54. The second electrical contact 53.1 is continued on the left and right of the spaces 56 as second electrical contact 53.2 and 53.3. The electrical contacts 53.1, 53.2 and 53.3 are substantially coplanar and spaced apart from one another, i.e. they do not mutually touch one another. They can be produced by the structuring of an initially continuous metal layer. Capacitive layers 55 are situated laterally with respect to the resistive layer 51 and in a manner separated from the latter by the spaces 56.

The fifth embodiment differs from the fourth embodiment in that only the first electrical contact or the first metal layer 52 is continuous, but the second metal layer is structured. Furthermore, the fifth embodiment differs from the fourth embodiment in that the capacitive layer 55 or the capacitive layers 55 is or are separated from the resistive layer 51. In the electrical equivalent circuit diagram this means that the measuring resistor R has coupled to it one or two capacitances C having a common connection with the resistor R, wherein the second connection of the capacitance or of the capacitances can be connected in an electrically isolated manner, for example can be grounded.

Figure 7:
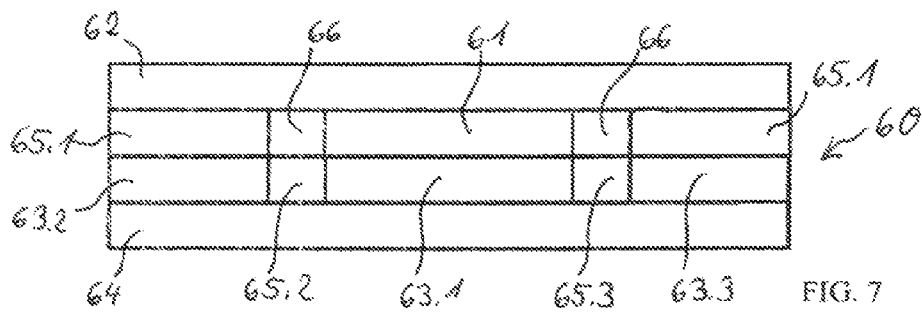
FIG. 7 shows a schematic side view of a sixth embodiment of a measuring resistor (vertical current flow)

FIG. 7 shows a schematic side view of a measuring resistor 60 in accordance with the sixth embodiment once again with a vertical current flow. The measuring resistor 60 has a resistive layer 61, a first electrical contact 62, a second electrical contact 63.1, 63.2, 63.3, a carrier 64, capacitive layers 65.1, 65.2, 65.3 and delimiting spaces 66. A structured second metal layer 63.1, 63.2 and 63.3 is applied to the carrier 64. The metal layers 63.1, 63.2 and 63.3 do not touch one another. A capacitive layer 65.2 is arranged in the spacing between the second electrical contact 63.2 and the electrical contact 63.1. A capacitive layer 65.3 is arranged in the spacing between the electrical contact or the metal layer 63.1 and the section 63.3. The capacitive layers 65.2 and 65.3 are substantially coplanar with respect to the metal layers 63.1, 63.2 and 63.3. All five layers mentioned above are arranged on the carrier 64. The statements made in respect of the carriers explained above hold true for the carrier 64.

The capacitive layers 65.1 are arranged on the metal layer sections 63.2 and 63.3. The capacitive layers 65.1, 65.2 and 65.3 can all be composed of the same material and have the same dielectric constant. However, it is also possible to use different dielectric constants and/or different materials.

The resistive layer 61 is applied on the metal layer section 63.1. The explanations given above in respect of resistive layers hold true for the dimensioning and the material of the resistive layer 61. The resistive layer 61 is spaced apart from the coplanar capacitive layers or the capacitive layer 65.1 by the space 66. The space 66 can be filled with air or with some other suitable, nonconductive filling material. The first electrical contact or the first metal layer 62 is applied on an upper surface of the resistive layer 61, of the empty space 66 and of the capacitive layer 65.1. The electrical contact layer or metal layer 62 is continuous and contacts the upper surface of the resistive layer 61 and the upper surfaces of the capacitive layers 65.1. The sixth embodiment differs from the fifth embodiment by virtue of the capacitive layers 65.2 and 65.3, which fill part of the space 56 from FIG. 6.

In the equivalent circuit diagram, a capacitance C is thus connected to the resistor R at a first connection, which capacitance can be coupled by its second connection to a different voltage or to ground. The second connection of the resistor R is then likewise coupled to the same connection via a capacitance C. Capacitors which can be connected to a common potential are thus coupled to both connection sides of the resistor R.

Figure 8:
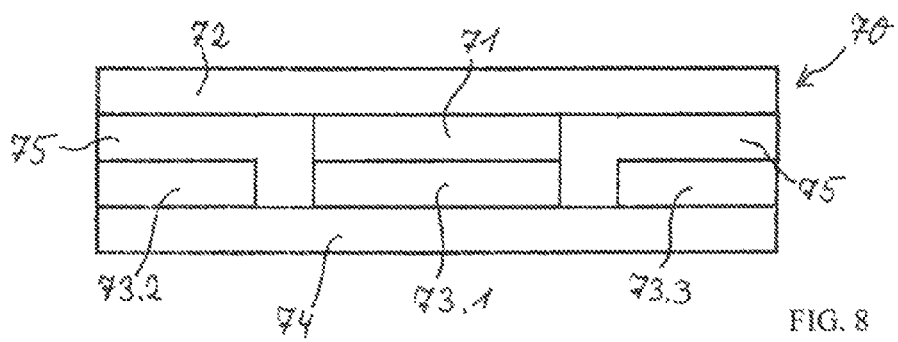
FIG. 8 shows a schematic side view of a seventh embodiment of a measuring resistor (vertical current flow)

FIG. 8 shows in a schematic side view a measuring resistor 70 in accordance with a seventh embodiment, i.e. once again with vertical current flow. The measuring resistor 70 has a resistive layer 71, a first metal layer 72, a structured second metal layer 73.1, 73.2 and 73.3, a carrier 74, and a capacitive layer/capacitive layers 75. The carrier 74 and the metal layers 72 and 73 and the resistive layer 71 are arranged in the same way as in the embodiments in accordance with FIGS. 6 and 7, and so further explanations in respect thereof are unnecessary.

The seventh embodiment differs from the fifth and sixth embodiments by virtue of the capacitive layer 75, which is arranged firstly between the second metal layer 73.2 and 73.3 and the first metal layer 72, i.e. in a manner substantially coplanar with respect to the resistive layer 71, and also between the second metal layer sections 73.2 and 73.1, and 73.1 and 73.3. The seventh embodiment does not have a separate delimiting space as denoted by reference sign 56 in FIG. 6 and by reference sign 66 in FIG. 7. The capacitive layer 75 runs not only in the plane of the resistive layer 71 but also in the plane of the second metal layer 73. It practically also fills the spaces 56, 66. In terms of the equivalent circuit diagram, the seventh embodiment corresponds to the sixth embodiment.

The above-described measuring resistors with vertical current flow enable easy integration into a semiconductor housing. The first metal layer can comprise a rear-side metalization of a semiconductor die. The first metal layer can comprise a semiconductor contact area onto which a semiconductor die is soldered. The second metal layer can comprise a leadframe. The second metal layer can be a leadframe. It is therefore possible to apply to a leadframe firstly a resistive layer and optionally in addition in a capacitive layer. The resistive layer can be structured such that it has a defined resistance value, as described above. The second metal layer can then be applied to the resistive layer and, if appropriate, the capacitive layer, a power component being applied to said second metal layer in a conventional manner. The application can comprise soldering, adhesive bonding or some other type of application. The power semiconductor together with the integrated measuring resistor can subsequently be housed. The measuring resistor is then situated in the current path already within the housing and can be contacted via the leadframe. A semiconductor housing or semiconductor package thus already comprises a measuring resistor. In this case, the carrier 34, 44, 54, 64, 74 can also be dispensed with.

In another embodiment, the measuring resistor is integrated or embedded into a printed circuit board (PCB). In such an embodiment, the first metal layer and/or the second metal layer can constitute metal layers of the printed circuit board.

Embodiments based on a horizontal current flow are described below with reference to FIGS. 9 to 16.

Figure 9:
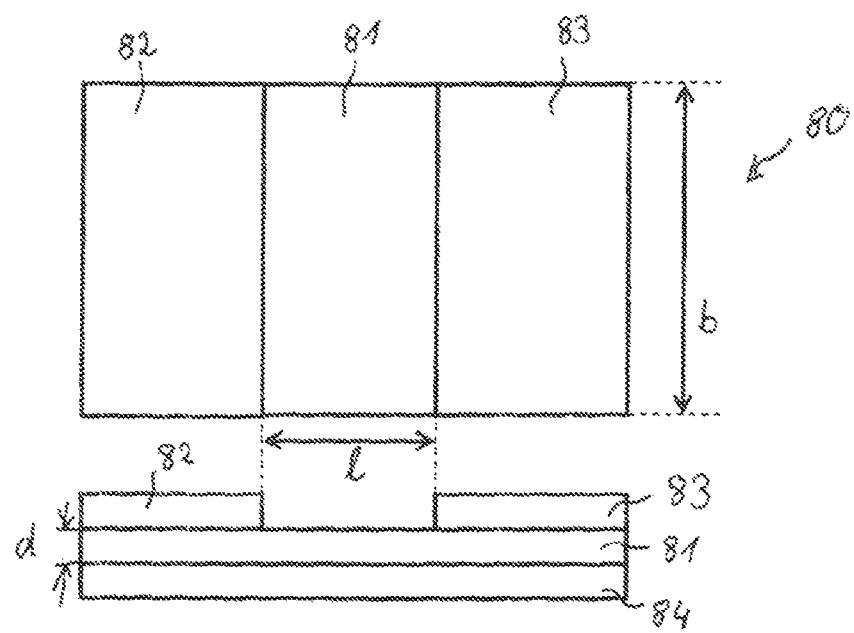
FIG. 9 schematically shows a measuring resistor in accordance with an eighth embodiment in plan view and in side view (horizontal current flow)

FIG. 9 schematically shows a measuring resistor 80 in accordance with an eighth embodiment in plan view and in side view. Measuring resistor 80 comprises a resistive layer 81 having a thickness d, a first metal layer 82, a second metal layer 83 and a carrier 84. The resistive layer 81 has an upper surface and a lower surface, which are spaced apart from one another by the thickness d of the resistive layer. The first metal layer 82 is arranged on the upper surface of the resistive layer 81. It forms a first electrical contact. The second metal layer 83 is likewise arranged on the upper surface of the resistive layer 81. It forms a second electrical contact. The first metal layer 82 and the second metal layer 83 are arranged such that they do not touch one another and are at a first distance l from one another over a first width b. The distance l is less than the width b.

An electric current coupled or fed into the first electrical contact 82 will overcome the distance between the first metal layer 82 and the second metal layer 83 within the resistive layer 81. That is to say that the electric current is coupled into the resistive layer 81 over the width b and will flow through the resistive layer over the length l. The current flow takes place parallel to the layer extent. The current will couple into the second electrical contact 83 over the width b. By virtue of the fact that the width b is significantly greater than the length l, the resistor has a low parasitic inductance.

The resistive layer 81 can be arranged on the carrier 84. The carrier 84, as explained above, can be composed of the material FR4, for example. In one embodiment, a printed circuit board can be arranged on the lower surface of the resistive layer 81.

Figure 10:
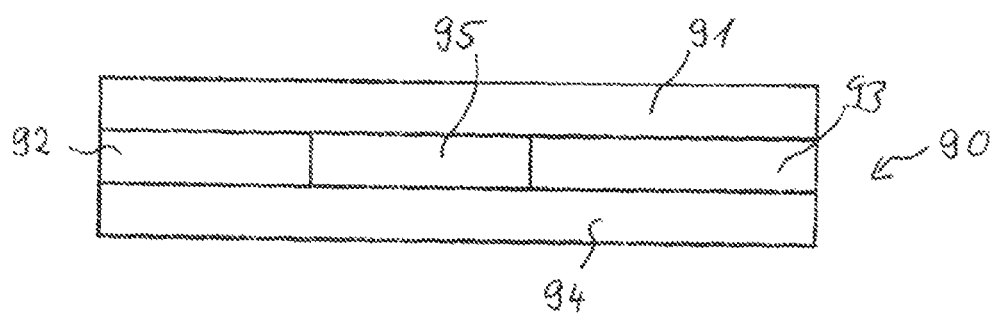
FIG. 10 shows a schematic side view of a ninth embodiment of a measuring resistor (horizontal current flow)

FIG. 10 shows a schematic side view of a measuring resistor 90 in accordance with a ninth embodiment with horizontal current flow. The measuring resistor 90 has a resistive layer 91, a first metal layer 92 and a second metal layer 93, a carrier 94 and spacing 95. The statements made above in respect of the thickness and the material selection hold true for the resistive layer 91. The electrical contacts 92 and 93 are arranged as described with reference to FIG. 9 for the electrical contacts 82 and 83 of the eighth embodiment.

The ninth embodiment differs from the eighth embodiment to the effect that the carrier 94, which can be a printed circuit board, is arranged at the electrical contacts 92 and 93 at the surface facing away from the resistive layer. A spacing 95 between the first metal layer 92 and the second metal layer 93 can be free, i.e. filled with air, or can be filled with a suitable electrically nonconductive filling material.

Figure 11:
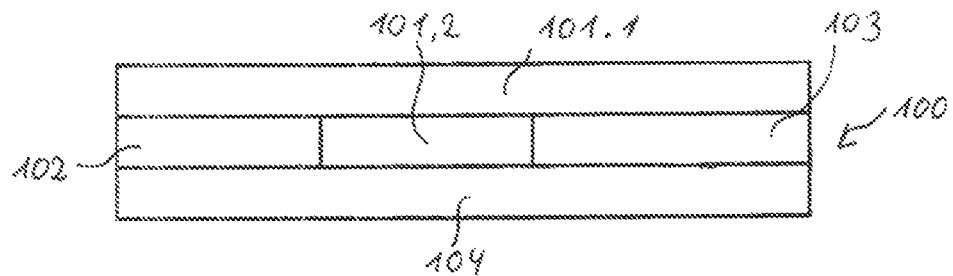
FIG. 11 shows a schematic side view of a tenth embodiment of a measuring resistor (horizontal current flow)

FIG. 11 shows a measuring resistor 100 in a schematic side view in accordance with a tenth embodiment with horizontal current flow. The measuring resistor 100 has a resistive layer 101.1, 101.2, a first electrical contact 102, a second electrical contact 103 and a carrier 104. The arrangement of the individual parts with respect to one another corresponds to the arrangement as illustrated for the ninth embodiment in FIG. 10. More detailed explanations in respect thereof are therefore unnecessary.

The tenth embodiment differs from the ninth embodiment in that the empty space 95 in the ninth embodiment is filled by a further resistive layer in the tenth embodiment. An electric current applied to the first electrical contact can thus also couple into the resistive region via a side area. The resistive region, situated in a manner substantially coplanar with respect to the metal layers 102 and 103, is designated by the reference sign 101.2. Lying above it and identified by the reference sign 101.1 is the resistive layer, which contacts an upper surface of the first metal layer and an upper surface of the second metal layer 103 and an upper surface of the resistive layer 101.2. The resistive layers 101.1 and 101.2 can consist of the same material or of different material.

Figure 12:
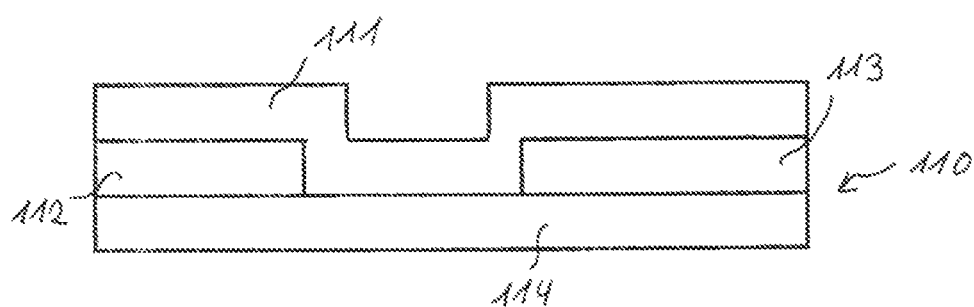
FIG. 12 shows a schematic side view of an eleventh embodiment of a measuring resistor (horizontal current flow)

FIG. 12 schematically shows a side view of a measuring resistor 110 in accordance with an eleventh embodiment with horizontal current flow. The measuring resistor 110 has a resistive layer 111 and a carrier 114, on which two metal layers 112 and 113 are arranged. The arrangement of the carrier 114 and the metal layers 112 and 113 with respect to one another corresponds to the arrangement of the carriers 94, 104 with respect to the metal layers 92, 102 and 93, 103 in embodiments 9 and 10 (FIGS. 10 and 11). The resistive layer 111 is applied to the upper surfaces of the metal layers 112 and 113 and to the exposed upper surface of the carrier 114. Such a structure arises for example when a resistive film is applied by lamination. However, it can also arise as a result of some other coating process.

The explanations already given above hold true for the dimensioning and the material selection of the resistive layer 111.

Thus, both in the tenth embodiment, as illustrated in FIG. 11, and in the eleventh embodiment, as illustrated in FIG. 12, the interspace between the first metal layer and the second metal layer is filled by a resistive layer over the width b and the distance l.

Figure 13:
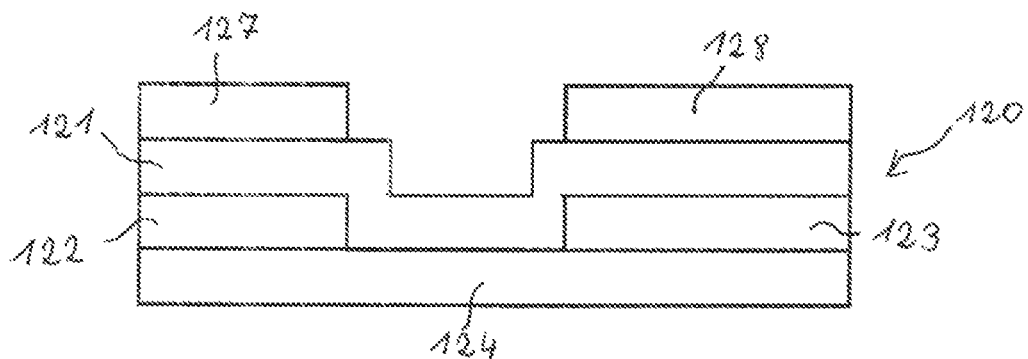
FIG. 13 shows a schematic side view of a twelfth embodiment of a measuring resistor (horizontal current flow)

FIG. 13 shows a measuring resistor 120 in a schematic side view in accordance with a twelfth embodiment with horizontal current flow. Measuring resistor 120 comprises a resistive layer 121, a first metal layer 122, a second metal layer 123 and a carrier 124, and also a third metal layer 127 and a fourth metal layer 128. The twelfth embodiment builds on the eleventh embodiment. The arrangement of the carrier 124, of the metal layers 122 and 123 and of the resistive layer 121 correspond to the arrangement of the corresponding elements 114, 112, 113 and 111.

The twelfth embodiment differs from the eleventh embodiment by virtue of the third metal layer 127, which is arranged on the upper surface of the resistive layer opposite the first metal layer, and by virtue of the fourth metal layer 128, which is arranged on the upper surface of the resistive layer opposite the second metal layer. The third metal layer 127 and the fourth metal layer 128 do not touch one another. They are opposite one another over a width $b_2$ that is less than or equal to the first width b, with a second distance $l_2$ that is greater than or equal to the first distance l. Advantageously, the current coupling in to the resistive layer can thus take place from two sides, namely via the first metal layer 122 and the third metal layer 127. Correspondingly, the coupling-out from the resistive layer can take place via two metal layers, namely the second metal layer 123 and the fourth metal layer 128. In the case of high-current applications with currents in the range of from 1 A to hundreds of amperes, the components are subjected to a high thermal loading. Said thermal loading is reduced by an enlargement of the coupling-in area or contact area between metal layer and resistive layer.

Figure 14:
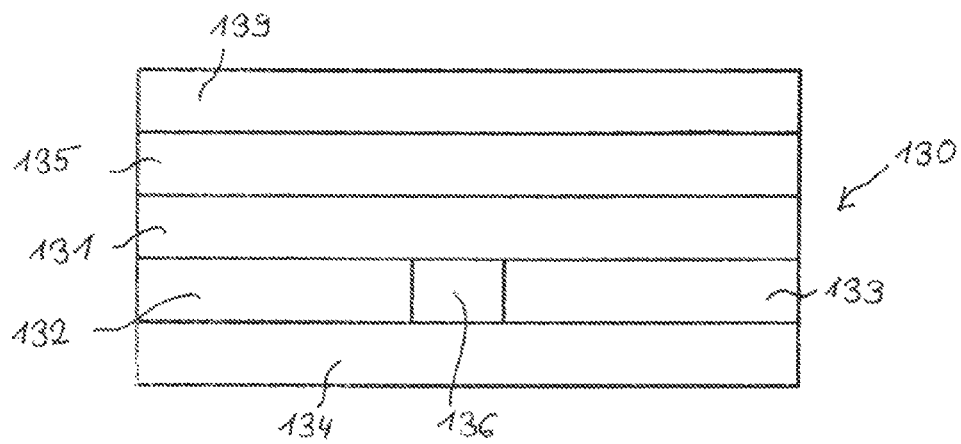
FIG. 14 shows a schematic side view of a thirteenth embodiment of a measuring resistor (horizontal current flow)

FIG. 14 shows in a schematic side view a measuring resistor 130 in accordance with a thirteenth embodiment with horizontal current flow. The measuring resistor 130 comprises a carrier 134, which can again be a printed circuit board, e.g. composed of FR4 or the like. A first electrical contact 132 and a second electrical contact 133 are applied on the carrier 134. The two electrical contacts 132 and 133 are spaced apart from one another and separated from one another by a spacing 136. The statements made above correspondingly hold true for the distance between the two electrical contacts. That is to say that they are opposite one another over a width b at a distance l, wherein b is very much greater than l. A resistive layer 131 is arranged on a surface of the metal layers 132 and 133 which faces away from the carrier 134. The statements made above hold true for said resistive layer. Accordingly, an electric current is coupled into the resistive layer 131 from the electrical contact 132 and is coupled out again via the electrical contact 133.

A capacitive layer 135 is arranged on a surface of the resistive layer 131 which faces away from the electrical contacts 132 and 133. The capacitive layer 135 can be a capacitance film. The statements made above with regard to the embodiments with vertical current flow hold true for the capacitance film. A further, third electrical contact 139 is arranged on the capacitance layer 135. The metal layer 139 is accordingly arranged on a surface of the capacitance layer 135 which faces away from the resistive layer 131.

In the equivalent circuit diagram, this arrangement results in a coupling of capacitances C to the resistor R in a manner similar to the sixth and seventh embodiments. Unlike in the sixth and seventh embodiments, however, here the capacitive layer is not situated by itself between two electrical contacts, rather the resistive layer is arranged in series with the capacitive layer. Thus, an R-C series circuit is situated between the first electrical contact 132 and the third electrical contact 139, and an R-C series circuit is situated between the second electrical contact 133 and the third electrical contact 139.

Figure 15:
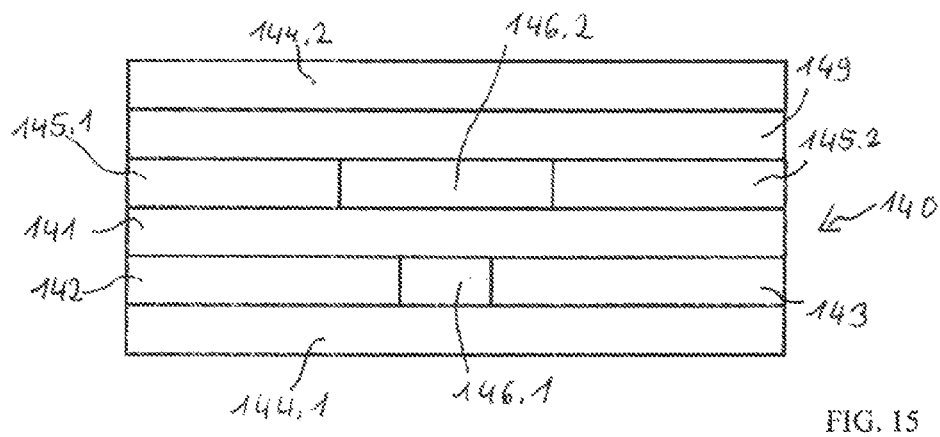
FIG. 15 shows a schematic side view of a fourteenth embodiment of a measuring resistor (horizontal current flow)

FIG. 15 shows in a schematic side view a measuring resistor 140 in accordance with a fourteenth embodiment with horizontal current flow. The measuring resistor 140 comprises a resistive layer 141, a first electrical contact 142, a second electrical contact 143, a first carrier 144.1 and a second carrier 144.2, capacitive layers 145.1 and 145.2, a first spacing 146.1, a second spacing 146.2 and a third electrical contact 149.

On the first carrier 144.1, two metal layers 142 and 143 arranged in a manner spaced apart from one another are arranged as first and second electrical contacts. The spacing 146.1 between the two metal layers 142 and 143 can be filled by a non-electrically conductive filling material or can remain free. As in the preceding embodiment, the resistive layer 141 is arranged on the coplanar metal layers 142 and 143, said resistive layer bridging the spacing 146.1. The dimensioning of width b and length l corresponds to the explanations in the other embodiments mentioned above.

Capacitive layers 145.1 and 145.2 are arranged on that side of the resistive layer 141 which faces away from the electrical contacts 142 and 143, said capacitive layers being spaced apart from one another. The second spacing 146.2 lies between the capacitive layer 145.1 and the capacitive layer 145.2, which second spacing can in turn be filled by an electrically nonconductive filling material. The third electrical contact 149 is arranged as a continuous metal layer on the coplanar capacitive layers 145.1 and 145.2.

In the present embodiment, a further carrier, the second carrier 144.2, is arranged on the third electrical contact 149. Said second carrier 144.2 is optional. With the second carrier 144.2, the present measuring resistor can for example also be embedded in a multilayer printed circuit board. In the fourteenth embodiment, too, by means of the capacitive layers 145.1, 145.2, a series circuit formed by the resistive layer 141 and the capacitive layer 145.1 between the first electrical contact 142 and the third electrical contact 149 and a series circuit formed by the resistive layer 141 and the capacitive layer 145.2 between the second electrical contact 143 and the third electrical contact 149 are achieved. This RC filter thus formed can influence the bandwidth of the measuring resistor in a targeted manner. In the present fourteenth embodiment, there is no change to the dimensioning of the measuring resistor over the thickness of the resistive layer 141, the distance l between the first electrical contact 142 and the second electrical contact 143 and the width over which the two electrical contacts are opposite one another.

Figure 16:
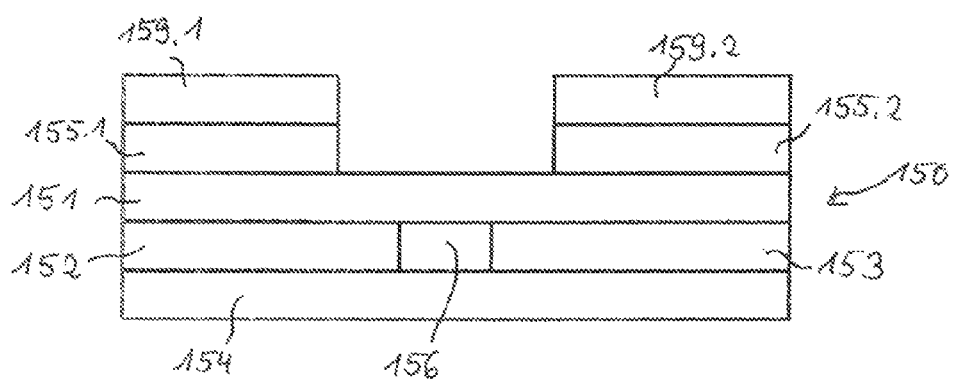
FIG. 16 shows a schematic side view of a fifteenth embodiment of a measuring resistor (horizontal current flow)

FIG. 16 shows a measuring resistor 150 in a schematic side view in accordance with a fifteenth embodiment with horizontal current flow. The measuring resistor 150 comprises a resistive layer 151, a first electrical contact 152, a second electrical contact 153, a carrier 154, capacitive layers 155.1 and 155.2, a spacing 156, and a structured third electrical contact 159.1, 159.2. The first electrical contact 152 spaced apart from the second electrical contact 153 are arranged on the carrier 154 in a manner already known in accordance with the other embodiments. A spacing 156 having the width b and the length l is formed between the two coplanar electrical contacts. The spacing 156 can be filled by an electrically nonconductive filling material.

The resistive layer 151 is arranged on the electrical contacts 152 and 153 and, if appropriate, on the filling material 155. In a manner corresponding to the arrangement in the fourteenth embodiment, two capacitive layer sections 155.1 and 155.2 are arranged in a manner spaced apart from one another on the resistive layer 151. Unlike in the fourteenth embodiment, electrical contacts 159.1 and 159.2 are arranged only on the capacitive layers 155.1 and 155.2 in the fifteenth embodiment. That is to say that the electrical contacts 159.1 and 159.2 are spaced apart from one another and do not touch one another. Thus, two separate RC filters are formed, which can be coupled to different potentials or to different metal layers.

Figure 17:
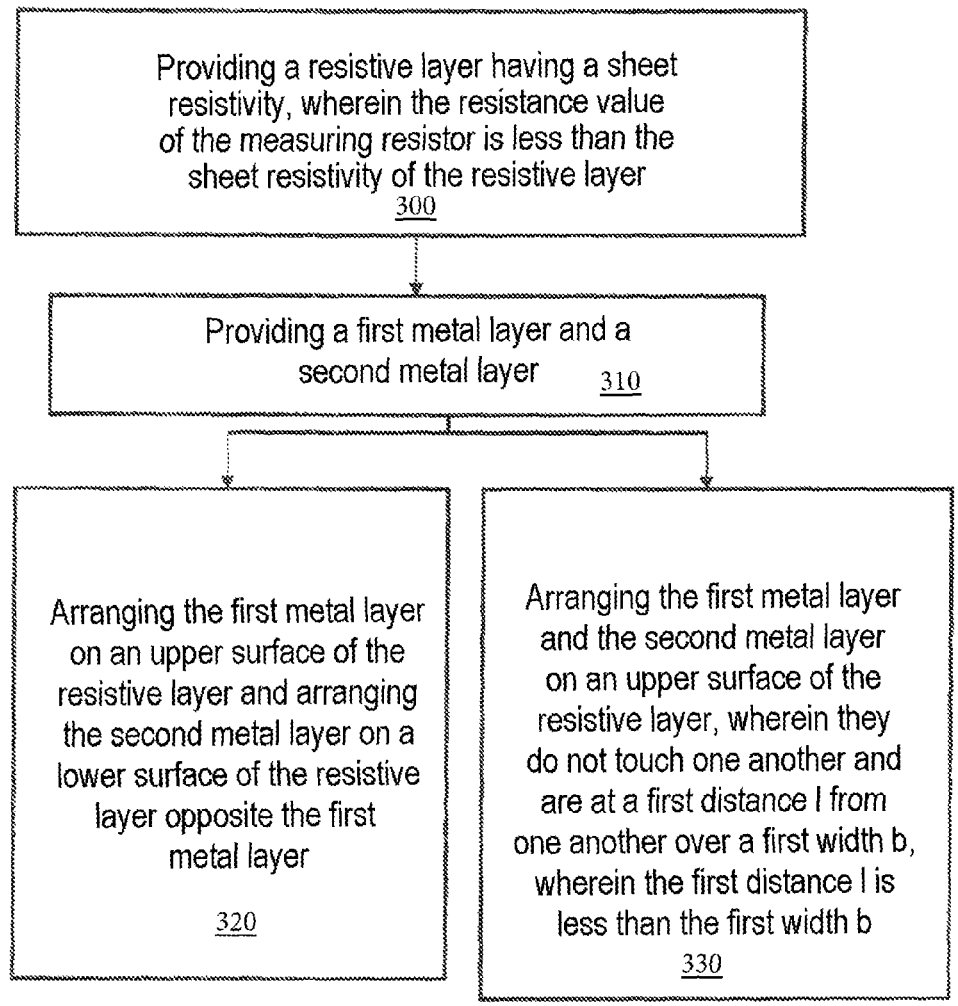
FIG. 17 shows a flow chart of a method according to the invention.

FIG. 17 shows a flowchart of a method according to the invention. In order to produce a measuring resistor for high-current measurements, it is necessary firstly to provide a resistive layer having a sheet resistivity (300). The resistive layer has an upper surface and a lower surface, which are spaced apart from one another by a thickness of the resistive layer. The material of the resistive layer and the thickness of the resistive layer define the sheet resistivity. In this case, the resistance value to be obtained in the measuring resistor is less than the sheet resistivity of the resistive layer. The resistance value of the measuring resistor is defined by the resistive layer. The method furthermore comprises providing a first metal layer and a second metal layer (310). The first metal layer serves as first electrical contact and, for example, for feeding an electric current into the resistive layer. The second metal layer serves as second electrical contact and, for example, for coupling the electric current out from the resistive layer.

The method provides two alternative routes for producing the measuring resistor. In accordance with the left branch in FIG. 17, the first metal layer is arranged on the upper surface of the resistive layer, while the second metal layer is arranged on the lower surface of the resistive layer opposite the first metal layer (320). A measuring resistor having the vertical current flow defined above is thus produced. The current flows perpendicularly to the extent of the resistive layer.

In the second alternative in accordance with the right branch in FIG. 17, the first metal layer and the second metal layer are arranged on the upper surface or on the lower surface, at any rate on the same surface of the resistive layer (330). The first metal layer once again forms a first electrical contact for coupling in an electric current and the second metal layer once again forms a second electrical contact for coupling out the electric current. The first metal layer and the second metal layer do not touch one another. They are at a first distance l from one another over a first width b, wherein the first distance l is less than the first width b. This geometrical stipulation has the effect that the current flow through the resistive layer flows over a short length in relation to the width of the current flow or of the current path provided. A very low parasitic inductance is thus produced. This has a direct effect on the bandwidth, which is in the gigahertz range with the measuring resistor according to the invention.

In one embodiment, a capacitive layer having a dielectric constant or relative permittivity of between approximately 4 and approximately 5 can additionally be provided. The relative permittivity can have, in particular a value of approximately 4.4. The capacitive layer can be arranged in a manner substantially coplanar with respect to the resistive layer and can be structured in embodiments. The capacitive layer can form a film with the resistive layer. The capacitive layer is arranged such that it becomes located between two electrical contacts. The capacitive layer makes it possible to couple to the measuring resistor capacitances which can be used to influence the bandwidth of the circuit. For example, undesired oscillation effects, e.g. in the harmonic range, can thereby be prevented.

Both in the embodiments with vertical current flow and in the embodiments with horizontal current flow, a relatively large contact area between the coupling-in and the coupling-out electrical contact and the resistive layer is possible. This enlarged contact area improves the thermal behavior in comparison with the prior art. The thickness of the metal layers or of the electrical contacts can be between 35 μm and 105 μm. In order to ensure a better heat dissipation, the layer thicknesses can be 150 μm.

Figure 18:
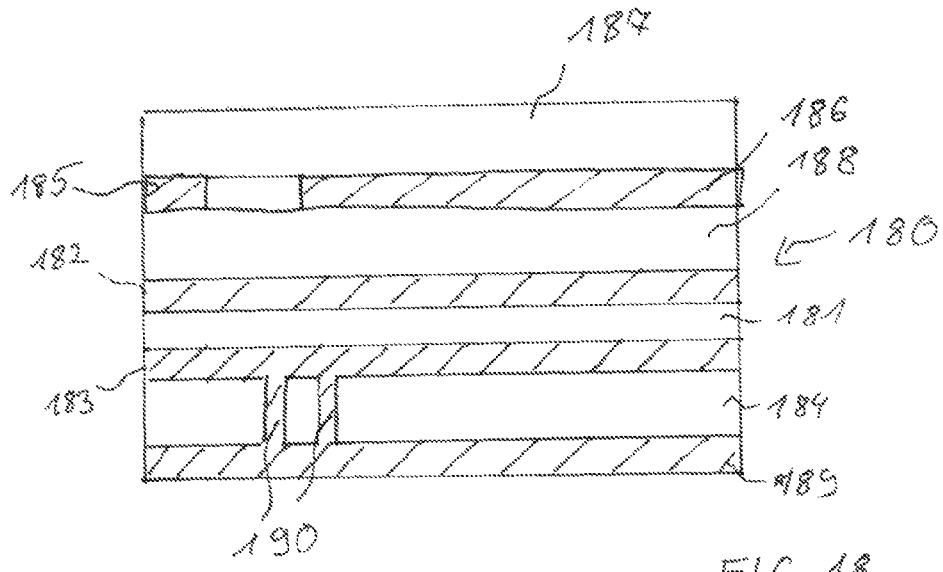
FIG. 18 shows a semiconductor package in accordance with a first embodiment into which a measuring resistor with vertical current flow is integrated.

FIG. 18 schematically shows a semiconductor package 180 in accordance with a first embodiment. The semiconductor package 180 can be a laminated package. One exemplary laminated package is for example the so-called "Blade" package from Infineon. The semiconductor package 180 comprises a resistive layer 181, arranged between a first electrical contact 182 and a second electrical contact 183. The semiconductor package 180 furthermore comprises a carrier 184, a third electrical contact 185, a fourth electrical contact 186, a second carrier 187 and a semiconductor die or semiconductor chip 188.

The first carrier 184 can be an FR4 substrate. The first carrier can also be composed of some other suitable material. The second electrical contact 183 is arranged on the first carrier 184. The first carrier 184 can have a metal layer 189 on a rear side facing away from the second electrical contact 183, said metal layer being connected to the second electrical contact 183 via plated-through holes 190.

The first electrical contact 182 is connected to a first side of the semiconductor die 188 by a side facing away from the resistive layer 181. A second side of the semiconductor die 188, which is opposite the first side, is connected to the third electrical contact 185 and the fourth electrical contact 186. The second carrier 187 is arranged above the third electrical contact 185 and the fourth electrical contact 186. The second carrier 187 can be an FR4 substrate. The second carrier 187 can also be composed of some other suitable material.

The semiconductor die 188 is arranged between the two carriers 184 and 187. The semiconductor die can be a MOS field effect power transistor. The first electrical contact 182 can be a drain contact 182. The third electrical contact 185 can be a gate contact 185 and the fourth electrical contact 186 can be a source contact 186.

The resistive layer 181 serving as measuring resistor is connected between the drain contact 182 and an external electrical contact, which is formed from the second electrical contact 183 and the metal layer 189. The measuring resistor 181 is integrated directly into the semiconductor package 180 and a voltage drop across the measuring resistor can be tapped off via the contacts 182 and 183.

The semiconductor chip 188 can also comprise two MOSFET transistors interconnected as a buck converter. The semiconductor chip 188 can also comprise two MOSFET transistors and a controller, which are interconnected with the measuring resistor as illustrated in FIG. 1.

Figure 19:
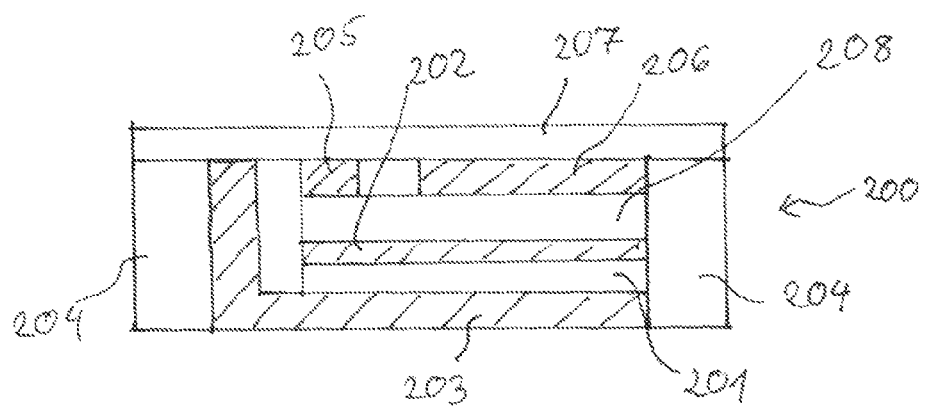
FIG. 19 shows a semiconductor package in accordance with a second embodiment into which a measuring resistor with vertical current flow is integrated.

FIG. 19 schematically shows a semiconductor package 200 in accordance with a second embodiment. The semiconductor package 200 can be a mold package or potting housing. One exemplary mold package is the so-called eWLB package from Infineon. The semiconductor package 200 comprises a resistive layer 201, a first electrical contact 202, a second electrical contact 203, a third electrical contact 205 and a fourth electrical contact 206, a semiconductor die or semiconductor chip 208, a potting compound 204 and a redistribution layer 207.

The first electrical contact 202 is arranged on a first side of the semiconductor chip 208 and the third electrical contact 205 and the fourth electrical contact 206 are arranged on a second side of the semiconductor 208, which is opposite the first side. The second electrical contact can be a drain contact 202, the third electrical contact can be a gate contact 205 and the fourth electrical contact can be a source contact 206.

The resistive layer 201, which forms a measuring resistor, lies between the drain contact 202 and the second electrical contact 203, which forms an external contact. The second electrical contact 203 is led from an underside of the semiconductor package 200 to a front side of the semiconductor package 200.

The potting compound 204 encapsulates the chip and the contacts at least at side surfaces of the semiconductor package 200. The redistribution layer 207 extends over the gate contact 205, the source contact 206, the external contact 203 led toward the top, and the potting compound 204.

As used herein, to the extent to which expressions such as, for instance, "contain", "have", "having" or variants thereof are used either in the detailed description or in the claims, it should be understood that such expressions are intended to be inclusive in a manner similar to the expressions "encompass", "comprise". The expression "by way of example" is intended to denote merely an example instead of the best or optimum example in accordance with any given criterion.

Even if a specific feature or a specific aspect of an embodiment of the invention may have been disclosed with regard to only one of a plurality of implementations, such a feature or such an aspect can be combined with one or a plurality of other features or aspects of the other implementations, as may be desirable and advantageous for an arbitrary given or determined application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A measuring resistor for high-current measurements, which has a defined resistance value, comprising:
   a resistive layer having a sheet resistivity, wherein the resistance value of the measuring resistor is defined by the resistive layer and is less than the sheet resistivity of the resistive layer, the resistive layer having an upper surface and a lower surface which are spaced apart from one another by a thickness of the resistive layer;
   a first metal layer arranged on the upper surface of the resistive layer;
   a second metal layer arranged on the lower surface of the resistive layer opposite the first metal layer; and
   at least one capacitive layer having an upper surface and a lower surface which are spaced apart from one another by a thickness of the capacitive layer,
   wherein a current to be measured by the measuring resistor flows through the thickness of the resistive layer from the first metal layer to the second metal layer,
   wherein the capacitive layer is arranged coplanar with respect to the resistive layer,
   wherein the first metal layer and the second metal layer extend over the capacitive layer.

2. The measuring resistor of claim 1, wherein the defined resistance value is in a range of between 100 and 500 mohms, and wherein the sheet resistivity is between 10 and 30 ohms.

3. The measuring resistor of claim 1, wherein the resistive layer comprises a nickel-phosphorus alloy.

4. The measuring resistor of claim 1, wherein the resistive layer and the capacitive layer are spaced apart from one another.

5. The measuring resistor of claim 1, wherein the second metal layer is structured, wherein a first part of the second metal layer is arranged on the capacitive layer and is spaced apart from a second part of the second metal layer, and wherein the second part is arranged on the resistive layer.

6. The measuring resistor of claim 1, wherein the second metal layer comprises a leadframe and wherein the first metal layer comprises a rear-side metalization of a semiconductor die.

7. A semiconductor package comprising a measuring resistor as claimed in claim 6.

8. The measuring resistor of claim 1, wherein the second metal layer is arranged on a printed circuit board.

9. A method for producing a measuring resistor for high-current measurements, which has a defined resistance value, the method comprising:
providing a resistive layer having an upper surface and a lower surface which are spaced apart from one another by a thickness of the resistive layer, wherein the resistive layer has a sheet resistivity, and wherein the resistance value of the measuring resistor is defined by the resistive layer and is less than the sheet resistivity of the resistive layer; and
providing a first metal layer and a second metal layer, wherein one of:
the first metal layer is arranged on the upper surface of the resistive layer and the second metal layer is arranged on the lower surface of the resistive layer opposite the first metal layer; or
the first metal layer and the second metal layer are arranged on the upper surface of the resistive layer, wherein they do not touch one another and are at a first distance from one another over a first width, wherein the first distance is less than the first width,
the method further comprising:
providing a capacitive layer;
arranging the capacitive layer coplanar with respect to the resistive layer, which extends between the first metal layer and the second metal layer, wherein the first and second metal layers also extend over the capacitive layer, or arranging the capacitive layer on the lower surface of the resistive layer if the first and the second metal layers are arranged on the upper surface of the resistive layer, and arranging an additional metal layer on a side of the capacitive layer which faces away from the resistive layer.

10. A measuring resistor for high-current measurements, which has a defined resistance value, comprising:
a resistive layer having a sheet resistivity, the resistance value of the measuring resistor being defined by the resistive layer and being less than the sheet resistivity of the resistive layer, the resistive layer having an upper surface and a lower surface which are spaced apart from one another by a thickness of the resistive layer;
a first metal layer arranged on the upper surface of the resistive layer; and
a second metal layer arranged on the lower surface of the resistive layer opposite the first metal layer,
wherein a current to be measured by the measuring resistor flows through the thickness of the resistive layer from the first metal layer to the second metal layer,
wherein the second metal layer comprises a leadframe,
wherein the first metal layer comprises a rear-side metalization of a semiconductor die.

11. The measuring resistor of claim 10, wherein the defined resistance value is in a range of between 100 and 500 mohms, and wherein the sheet resistivity is between 10 and 30 ohms.

12. The measuring resistor of claim 10, wherein the resistive layer comprises a nickel-phosphorus alloy.

13. The measuring resistor of claim 10, further comprising at least one capacitive layer having an upper surface and a lower surface which are spaced apart from one another by a thickness of the capacitive layer, wherein the capacitive layer is arranged coplanar with respect to the resistive layer, and wherein the first metal layer and the second metal layer extend over the capacitive layer.

14. The measuring resistor of claim 13, wherein the resistive layer and the capacitive layer are spaced apart from one another.

15. The measuring resistor of claim 13, wherein the second metal layer is structured, wherein a first part of the second metal layer is arranged on the capacitive layer and is spaced apart from a second part of the second metal layer, and wherein the second part is arranged on the resistive layer.

16. A semiconductor package comprising the measuring resistor of claim 10.

17. The measuring resistor of claim 10, wherein the second metal layer is arranged on a printed circuit board.

* * * * *